United States Patent [19]
Ulm, Jr. et al.

[11] Patent Number: 5,699,032
[45] Date of Patent: Dec. 16, 1997

[54] SURFACE-MOUNT FUSE HAVING A SUBSTRATE WITH SURFACES AND A METAL STRIP ATTACHED TO THE SUBSTRATE USING LAYER OF ADHESIVE MATERIAL

[75] Inventors: Steven Francis Ulm, Jr., Arlington Heights; Edwin James Harris, IV, Des Plaines; Matthew Michael Rybka, Chicago, all of Ill.

[73] Assignee: Littelfuse, Inc., Des Plaines, Ill.

[21] Appl. No.: 660,498

[22] Filed: Jun. 7, 1996

[51] Int. Cl.⁶ .................................................. H01H 85/04
[52] U.S. Cl. ........................... 337/297; 337/227; 337/404
[58] Field of Search ................................. 337/152, 227, 337/228, 297, 404, 405; 29/623

[56] References Cited

U.S. PATENT DOCUMENTS

| | | | |
|---|---|---|---|
| 3,619,725 | 11/1971 | Soden et al. | 317/101 A |
| 4,120,558 | 10/1978 | Seidler | 339/275 |
| 4,140,988 | 2/1979 | Oakes | 337/279 |
| 4,164,725 | 8/1979 | Wiebe | 337/198 |
| 4,198,744 | 4/1980 | Nicolay | 29/623 |
| 4,203,648 | 5/1980 | Seidler | 339/275 |
| 4,356,627 | 11/1982 | Hoffman | 29/849 |
| 4,503,415 | 3/1985 | Rooney et al. | 337/160 |
| 4,514,718 | 4/1985 | Birx | 337/407 |
| 4,533,896 | 8/1985 | Belopolsky | 337/232 |
| 4,540,969 | 9/1985 | Sugar | 337/232 |
| 4,547,830 | 10/1985 | Yamauchi | 361/104 |
| 4,605,278 | 8/1986 | Seidler | 339/275 |
| 4,612,529 | 9/1986 | Gurevich et al. | 337/255 |
| 4,626,818 | 12/1986 | Hilgers | 337/166 |
| 4,636,765 | 1/1987 | Krueger | 337/273 |
| 4,652,848 | 3/1987 | Hundrieser | 337/297 |
| 4,675,990 | 6/1987 | Viola et al. | 29/623 |
| 4,726,991 | 2/1988 | Hyatt et al. | 428/329 |
| 4,771,260 | 9/1988 | Gurevich | 337/231 |
| 4,788,626 | 11/1988 | Neidig et al. | 361/386 |
| 4,837,520 | 6/1989 | Golke | 324/550 |
| 4,851,806 | 7/1989 | Rohrer et al. | 337/231 |
| 4,873,506 | 10/1989 | Gurevich | 337/290 |
| 4,975,551 | 12/1990 | Syvertson | 200/144 |
| 5,084,691 | 1/1992 | Lester et al. | 337/297 |

(List continued on next page.)

FOREIGN PATENT DOCUMENTS

| | | |
|---|---|---|
| 0270954 A1 | 6/1988 | European Pat. Off. . |
| 0581428 A1 | 2/1994 | European Pat. Off. . |
| 0626714 A1 | 11/1994 | European Pat. Off. . |
| 3530354 A1 | 3/1987 | Germany . |
| 1604820 | 12/1981 | United Kingdom . |
| 2089148 | 6/1982 | United Kingdom . |
| WO 91/14279 | 9/1991 | WIPO . |

*Primary Examiner*—Leo P. Picard
*Assistant Examiner*—Jayprakash N. Gandhi
*Attorney, Agent, or Firm*—Wallenstein & Wagner Ltd

[57] ABSTRACT

A surface-mount fuse for protecting a circuit, includes a substrate having first and second surfaces, each surface having first, second, third, and forth ends, the substrate also having first, second, third, and fourth sides. The fuse also includes a metal strip evenly attached to the first surface of the substrate with a layer of adhesive material, the layer of adhesive material being disposed between the metal strip and the first surface of the substrate, the metal strip having a first connection region, a second connection region, and a non-linear fuse link therebetween. The fuse further includes first and second wire leads aligned substantially with and along the first and second connection regions, respectively, the first wire lead being conductively connected to the first connection region and horizontally projecting away from the first connection region, the second wire lead being conductively connected to the second connection region and horizontally projecting away from the second connection region, for connecting the fuse to the remainder of the circuit. The layer of adhesive material can include a polymeric material therein. One alternative for the wire leads can include clip leads or other terminal leads. The fuse also includes a protective layer disposed on the fuse link, the protective layer being in contact with and surrounding the upper and side surfaces of the fuse link of the metal strip. A method of making the same is also disclosed herein.

38 Claims, 4 Drawing Sheets

U.S. PATENT DOCUMENTS

| | | | |
|---|---|---|---|
| 5,095,297 | 3/1992 | Perreault et al. | 337/297 |
| 5,097,246 | 3/1992 | Cook et al. | 337/297 |
| 5,097,247 | 3/1992 | Doerrwaechter | 337/405 |
| 5,102,506 | 4/1992 | Tanielian et al. | 205/118 |
| 5,115,220 | 5/1992 | Suuronen et al. | 337/297 |
| 5,140,295 | 8/1992 | Vermot-gaud et al. | 337/297 |
| 5,148,141 | 9/1992 | Suuronen | 337/297 |
| 5,155,462 | 10/1992 | Morrill, Jr. | 337/3 |
| 5,166,656 | 11/1992 | Badihi et al. | 337/297 |
| 5,228,188 | 7/1993 | Badihi et al. | 29/623 |
| 5,262,754 | 11/1993 | Collins | 338/21 |
| 5,296,833 | 3/1994 | Breen et al. | 337/297 |
| 5,309,625 | 5/1994 | Onishi | 29/623 |
| 5,340,775 | 8/1994 | Carruthers et al. | 437/246 |
| 5,363,082 | 11/1994 | Gurevich | 337/227 |
| 5,374,590 | 12/1994 | Batdorf et al. | 437/173 |
| 5,453,726 | 9/1995 | Montgomery | 337/290 |

SURFACE-MOUNT FUSE HAVING A SUBSTRATE WITH SURFACES AND A METAL STRIP ATTACHED TO THE SUBSTRATE USING LAYER OF ADHESIVE MATERIAL

DESCRIPTION

1. Technical Field

The invention relates generally to a surface-mountable fuse for placement into and protection of the electrical circuit of a printed circuit board or other electrical circuit.

2. Background of the Invention

Printed circuit (PC) boards have found increasing application in electrical and electronic equipment of all kinds. The electrical circuits formed on these PC boards, like larger scale, conventional electrical circuits, need protection against electrical over-loads. In particular, circuit boards and other electrical circuits within the telecommunications industry need protection against electrical overload. This protection can be provided by subminiature fuses that are physically secured to the PC board.

One example of such a subminiature, surface-mount fuse is disclosed in U.S. Pat. No. 5,166,656 ('656 patent). The fusible link of this surface-mount fuse is disclosed as being covered with a three layer composite which includes a passivation layer, an insulating cover, and an epoxy layer to bond the passivation layer to the insulating cover. See '656 patent, column 6, lines 4–7. Typically, the passivation layer is either chemically vapor-deposited silica or a thick layer of printed glass. See '656 patent, column 3, lines 39–41. The insulating cover may be a glass cover. See '656 patent, column 4, lines 43–46. The fuse from the '656 patent has three layers protecting its fusible link. In addition, the fuse from the '656 patent has a relatively thick glass covering. There are several other features in the '656 patent fuse which are unnecessary in the present invention.

One additional previous fuse is disclosed in European Patent Application No. 270,954. This "chip-type" fuse includes a conducting member 3 and electrodes 4a and 4b that wrap around an insulating member. However, the electrodes are not unitary with the conducting member, and the connection to the circuit board takes place on the lower surface of the substrate. In addition, several steps are required to create the electrodes. Furthermore, the protecting member is spread across the entire upper surface of the fuse. This fuse includes several other disadvantages.

The present invention is designed to solve these and other problems.

SUMMARY OF THE INVENTION

The present invention is a surface-mount fuse for protecting a circuit including the fuse. The fuse includes a substrate having first and second surfaces, each surface having first, second, third, and forth ends, the substrate also having first, second, third, and fourth sides. The fuse also includes a metal strip evenly attached to the first surface of the substrate with a layer of adhesive material, with the layer of adhesive material being disposed between metal strip and the first surface of the substrate. The metal strip has a first connection region, a second connection region, and a non-linear fuse link therebetween. The fuse link has an upper surface and a side surface, and the first connection region is disposed along substantially the full length of the first end of the first surface of the substrate, the second connection region being disposed along substantially the full length of the second end of the first surface of the substrate. One form of the invention further includes first and second wire leads aligned substantially with and along the first and second connection regions, respectively. The first wire lead is conductively connected to the first connection region and horizontally projects away from the first connection region. The second wire lead is conductively connected to the second connection region and horizontally projects away from the second connection region, both for connecting the fuse to the remainder of the circuit.

The fuse also includes a protective layer that is disposed on the fuse link, with the protective layer being in contact with and surrounding the upper and side surfaces of the fuse link of the metal strip, and can also be disposed on at least a fraction of the first and second connection regions of the metal strip. A solder material is disposed between the first and second wire leads and the first and second connection regions, respectively, of the metal strip, for connecting the first and second wire leads to the first and second connection regions. The metal strip is made from a zinc alloy, and can be applied through a sheet of zinc foil.

The present invention can also include the use of a metal strip evenly attached to the first surface of the substrate with a layer of polymeric material. The layer of polymeric material has first and second surfaces each respectively having an adhesive material attached thereto. The layer of polymeric material is disposed between the metal strip and the first surface of the substrate. The adhesive material on the first surface of the layer of polymeric material connects the substrate to the first surface of the layer of polymeric material, and the adhesive material on the second surface of the layer of polymeric material connects the metal strip to the second surface of the layer of polymeric material.

A first terminal lead can be used instead of the first wire lead, and a second terminal lead can be used instead of the second wire lead. Furthermore, these terminal leads can take the form of clip leads, as will be described in detail below.

The present invention also includes the method of manufacture of the fuse. The method of manufacture uses a lamination step for laminating the substrate, the layer of adhesive material, and the sheet of metal together to form a unitary laminated sheet having a metal surface and a substrate surface. Alternative embodiments of the present invention may use alternative methods of manufacture, depending on the fuse being created, as will be described in detail below.

DETAILED DESCRIPTION OF THE PREFERRED EMBODIMENT

While this invention is susceptible of embodiment in many different forms, there is shown in the drawings and will herein be described in detail a preferred embodiment of the invention. It is to be understood that the present disclosure is to be considered as an exemplification of the principles of the invention. This disclosure is not intended to limit the broad aspect of the invention to the illustrated embodiment or embodiments.

Figure 9:
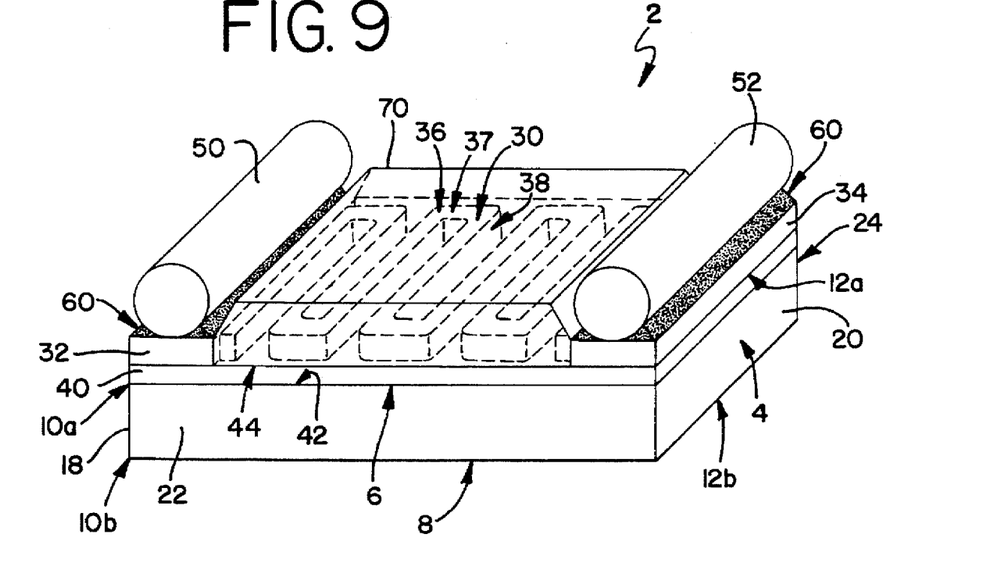
FIG. 9 is a perspective view of one surface-mount fuse in accordance with the present invention.
Figure 10:
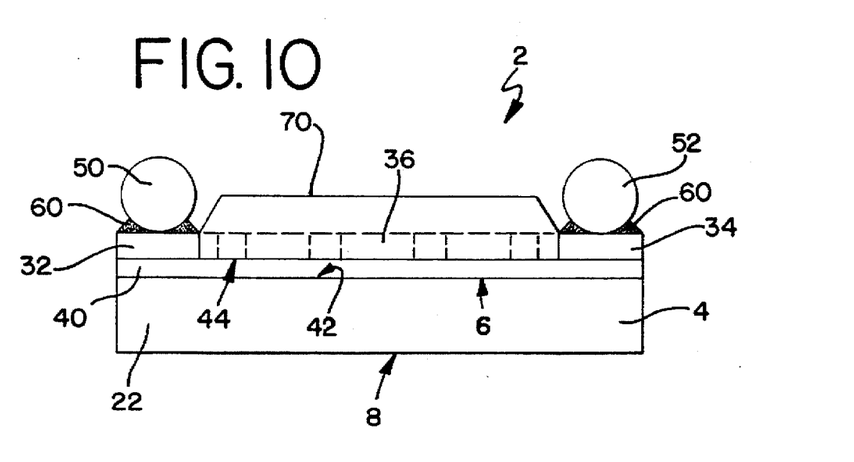
FIG. 10 is a side view of the view of FIG. 9.

One preferred embodiment of the present invention is shown in FIGS. 9 and 10, and portions of this embodiment used to make the surface-mount fuse 2 are shown in FIGS. 1 through 9. It has been the goal for this and other disclosed fuses to be generally capable of withstanding 600 volt power cross and lightening spikes, as well as UL Standard 1950 and Belcore 1459, although not necessary for the practice of the present invention. In addition, it has initially been a goal to create fuse ratings from about 0.25 (or lower) to about 1.5 Amps, although the specific concepts herein apply to fuses with higher ratings as well.

Referring to these Figures, the surface-mount fuse 2 is generally used for protecting a circuit when the circuit includes the fuse 2. The fuse 2 includes a substrate 4 which can be an FR-4 material, a melamine based composition, a polyamide, ceramic, or other material having similar insulating properties. The substrate 4 has a first surface 6 and second surface 8. Each surface 6, 8 has a first end 10a, 10b, a second end 12a, 12b, a third end 14a, 14b, and a fourth end 16a, 16b. The substrate also has a first side 18, a second side 20, a third side 22, and a fourth side 24. The fuse 2 also includes a metal strip 30 that is evenly attached to the first surface 6 of the substrate 4 with a layer of adhesive material 40. This adhesive is preferably non-flammable and non-conducting, and capable of withstanding high temperatures. The layer of adhesive material 40 is disposed between the metal strip 30 and the first surface 6 of the substrate 4 for attaching the metal strip 30 to the substrate 4. The adhesive 40 also acts as a thermal barrier between the substrate 4 and the metal strip 30.

The metal strip 30 has a first connection region 32, a second connection region 34, and a non-linear fuse link 36 therebetween. The fuse link 36 of the metal strip 30 has an upper surface 37 and a side surface 38. The first connection region 32 is disposed or located along substantially the full length of the first end 10a of the first surface 6 of the substrate 4, with the adhesive 40 therebetween. The second connection region 34 is disposed or located along substantially the full length of the second end 12a of the first surface 6 of the substrate 4. The metal strip is preferably made from a zinc alloy, but can also be made from Copper and Aluminum alloys, or other metals which provide the necessary characteristics for the particular application. Additionally, tin or a tin-lead alloy, or other metal, can be placed or deposited on the fuse link 36 of the metal strip 30 to create or enhance the M-effect. It should be understood by those skilled in the art that other conductive metals may be placed on the fuse link 36 to lower its melting temperature. In addition, this deposit need not be of any particular shape, but can take on any number of configurations. Further, Nickel, tin, tin-lead alloy, or other metal, can also be placed or deposited on the connection regions 32, 34 of the metal strip 30 to enhance solderability. This is performed because Zinc alone (the metal strip 30) tends to migrate and cause problems with the solder 60.

The fuse 2 of the embodiment in FIGS. 9 and 10 also has a first wire lead 50 and a second wire lead 52. The first wire lead 50 is aligned substantially with and along the first connection region 32, and the second wire lead 52 is aligned substantially with and along the second connection region 34. The first wire lead 50 is conductively connected to the first connection region 32 with the use of a solder material 60 (high temperature solder joint). The solder material 60 is disposed between the first and second wire leads 50, 52 and the first and second connection regions 32, 34, respectively, for connecting the first and second wire leads 50, 52 to the first and second connection regions 32, 34. The first wire lead 50 horizontally projects away from the first connection region 32. The second wire lead 52 is, likewise, conductively connected to the second connection region 34 with the use of the solder material 60. The second wire lead 52 also horizontally projects away from the second connection region 34. The first and second wire leads 50, 52 are provided for connecting the fuse 2 to the remainder of the circuit. Additionally, Nickel or other coating/-plating, such as a tin or tin/lead alloy, can be deposited on the wire leads/terminal leads 50, 52 or 50', 52'.

Figure 12:
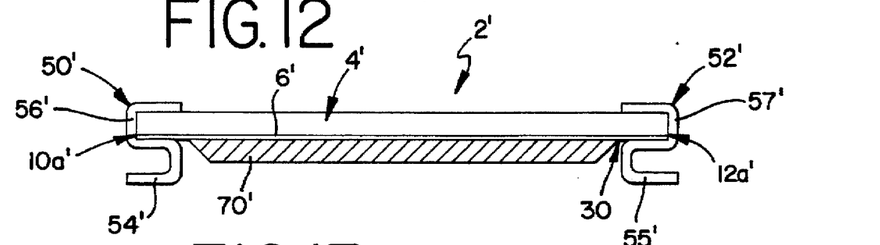
FIG. 12 is a side view of the surface-mount fuse from FIG. 11.

The surface-mount fuse 2 further includes a protective layer 70 that is disposed or deposited onto the fuse link 36. The deposited protective layer 70 contacts and surrounds the upper and side surfaces 37, 38 of the fuse link 36 of the metal strip 30. The protective layer 70 can also contact at least a fraction of the first and second connection regions 32, 34 of the metal strip 30, although it is preferable for the protective layer 70 not to overlap onto the connection regions 32, 34. However, it is preferable for the protective layer 70 to cover substantially all of the fuse link 36, and come close to the connection regions 32, 34. The protective layer 70 can be made of a polymeric material, an RTV material, or other material with similar characteristics. However, the preferred material is a polyurethane material (gel or paste), Part No. 9-20314, made by DYMAX Corporation. Other similar gels, pastes, or adhesives are suitable for the invention, as well. In addition to polymers, the protective layer 70 may also be comprised of plastics, conformal coatings, and epoxies. The preferable DYMAX Corporation material or other material should have a viscosity of about 28,000 centipoise, but can range from about 20,000 to about 35,000 centipoise. The protective layer 70 is provided for protecting the fuse 2 and fuse link 36 from impacts which may occur during automated assembly, is provided for protecting the fuse 2 from oxidation during use, is provided for preventing electrical arcing, and is also generally provided for the protection against other environmental concerns. The protective layer 70 forms a relatively tight seal over where the fuse link 36 exists. Further, in this way, the protective layer 70 inhibits corrosion of the fuse links 36 during their useful lives. This protective layer 70 can also serve as a means of providing for a surface for pick and place operations which use a vacuum pick-up tool, when the protective layer faces away from the circuit board in use. In addition, this protective layer 70 helps to control the melting, ionization and arcing which occur in the fuse link 36 during current overload conditions. The protective layer 70 or cover coat material provides desired arc-quenching characteristics, especially important upon interruption of the fuse link 36. The protective layer 70 can be clear and colorless for viewing the fuse link 36, although the fuse link 36 will typically be facing toward the circuit board during use. There are significant advantages, however, in having the metal strip 30 side of the fuse 2 facing toward the circuit board. Specifically, the second surface 8 of the substrate 4 can be used to mark the fuse 2, as is generally shown in FIG. 12 with prime designations. In addition, since the second surface 8 or top surface of the substrate 4 is substantially flat, pick and place machines that are used to manufacture circuit boards can utilize the flat surface of the second surface 8 of the substrate 4 to pick and place the fuse 2 into a circuit board. The protective layer, alternatively can be clear and colored for viewing the fuse link 36, and for using particular colors to designate, and correspond to, particular fuse ratings.

As a variation of the embodiment shown in FIGS. 9 and 10, the metal strip 30 is attached to the first surface 6 of the substrate 4 with the use of a layer of polymeric material 40. The layer of polymeric material 40 has a first surface 42 and second surface 44, each surface 42, 44 has an adhesive material attached thereto. The layer of polymeric material 40 is disposed or positioned between the metal strip 30 and the first surface 6 of the substrate 4. The adhesive material on the first surface 42 of the layer of polymeric material 40 connects or attaches the substrate 4 to the first surface 42 of the layer of polymeric material 40. Likewise, the adhesive material on the second surface 44 of the layer of polymeric material 40 connects or attaches the metal strip 30 to the second surface 44 of the layer of polymeric material 40. A lamination process can be used to perform the attachment during manufacture, as will be described in detail further below. The layer of polymeric material 40 is preferably a polyamide such as KAPTON polyamide material, when used. In use, this polyamide layer is typically about 1 mil thick, but can go up to about 15 mils thick. KAPTON polyamide material can be obtained from DUPONT Corporation. The KAPTON polyamide provides a thermal barrier between the metal strip 30 and the substrate 4, and thus, a lower operating temperature, as KAPTON polyamide has an operating temperature of around 250 degrees C, while the operating temperature of a substrate such as the FR-4 material is around 150 degrees C.

Figure 11:
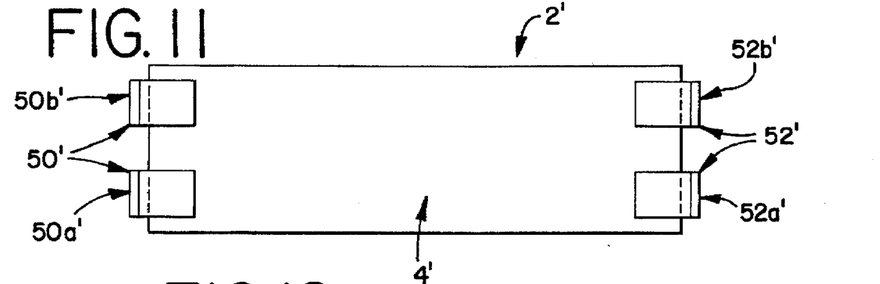
FIG. 11 is a bottom view of an additional embodiment of the surface-mount fuse from FIGS. 1–10, showing a 1.5 Amp rating for this particular embodiment.
Figure 13:
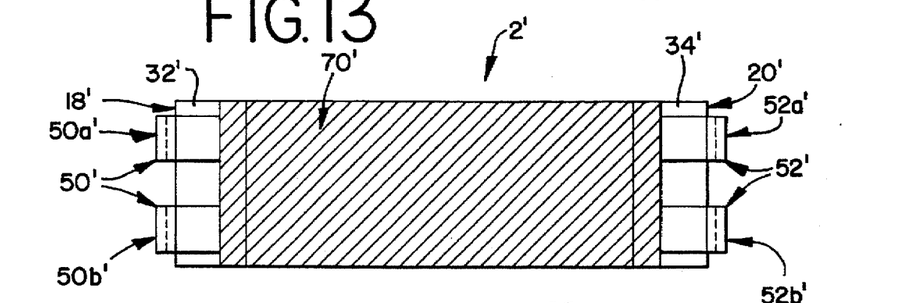
FIG. 13 is a top view of the surface-mount fuse from FIG. 11.

As an additional variation of the embodiment shown in FIGS. 9 and 10, the first and second wire leads 50, 52 need not be wire leads or terminals leads 50, 52 that have a similar shape, as shown. As such, a plurality of different types of terminal leads can be used in place thereof. In particular, one such variation is shown in FIGS. 11 through 13. In the fuse 2' of this additional embodiment, the first connection region 32' is disposed along substantially the full length of the first end 10a' of the first surface 6' of the substrate 4', and the second connection region 34' is disposed along substantially the full length of the second end 12a' of the first surface 6' of the substrate 4'. The terminal leads 50, 52 are instead first and second clip leads 50', 52', respectively. As shown in FIGS. 11 and 13, the first clip lead 50' can have a plurality of clips 50a', 50b', (preferably two clips) that can be integrally attached to one another, although each clip lead can be one integral clip. As shown in FIG. 12, each clip 50a', 50b' of the first clip lead 50' has a mounting portion 54', and a wrap-around portion 56'. The wrap-around portion 56' of the clips 50a', 50b' are aligned generally along the first connection region 32' and the first side 18' of the substrate 4', and are conductively connected to the first connection region 32'. The wrap-around portions 56' of the clips 50a', 50b' function to fasten the first clip lead 50' to the substrate 4' and first connection region 32'. The mounting portions 56' of the first clip lead 50' project away from the first connection region 32'. Likewise, the second clip lead 52' has a plurality of clips 52a', 52b', and can be integrally attached to one another. Each clip 52a', 52b' of the second clip lead 52' has a mounting portion 55' and a wrap-around portion 57'. The wrap-around portion 57' of the clips 52a', 52b' are aligned generally along the second connection region 34' and the second side 20' of the substrate 4', and are conductively connected to the second connection region 34'. The wrap-around portion 57' of the clips 52a', 52b' fasten the second clip lead 52' to the substrate 4 and the second connection region 34'. The mounting portion 55' of the second clip lead 52' project away from the second connection region 34'. As such, the first and second clip leads 50', 52' connect the fuse 2' to the remainder of the circuit.

The fuses 2, 2' can additionally have a copper layer on the second surface 8 of the substrate 4, that is capable of being etched to form markings. These markings can include the fuse rating or other indicia such as an indication of source. This copper layer (not shown) also provides some stiffness to the overall substrate (unitary laminated sheet) to prevent bowing of the overall substrate during processing.

The non-linear form of the fuse link 36 allows for variation of the fuse rating. Specifically, by varying the thickness, width (cross-sectional area), and the length of the fuse link 36 and metal strip 30, the rating can be increased and decreased accordingly. As is shown in FIGS. 9 and 10, the fuse link 36 has a serpentine, or back and forth, configuration which increases the length of the fuse link 36 from an otherwise linear fuse link extending directly across the fuse. By using a serpentine configuration, the effective length of the fuse link 36 may be increased, even though the distance between the leads (terminals) at the opposite ends of that link remain the same. In this way, a serpentine configuration provides for a longer fuse link 36 without increasing the dimensions of the fuse itself.

Figure 1:
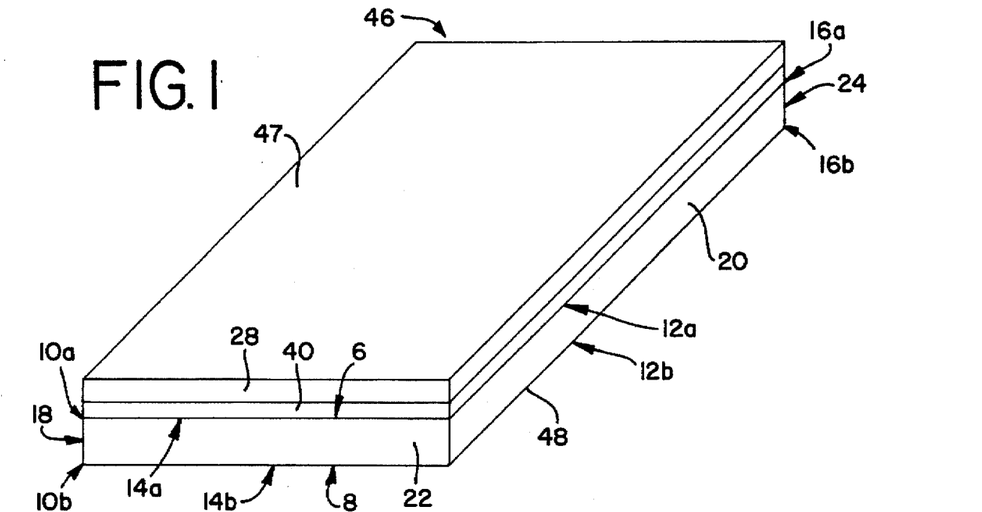
FIG. 1 is a perspective view of a substrate, a sheet of metal, and a layer of adhesive material therebetween, used to make a surface-mount fuse in accordance with the present invention.
Figure 2:
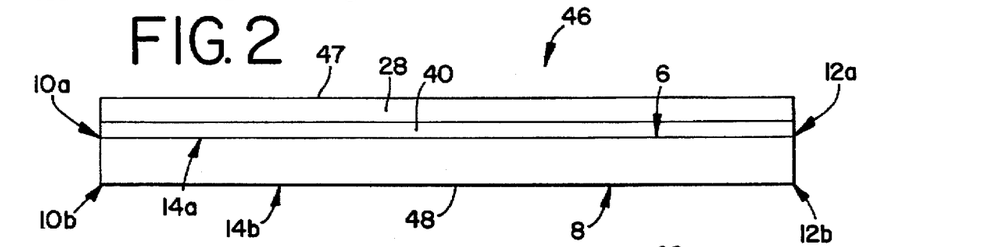
FIG. 2 is a side view of the view of FIG. 1.
Figure 3:
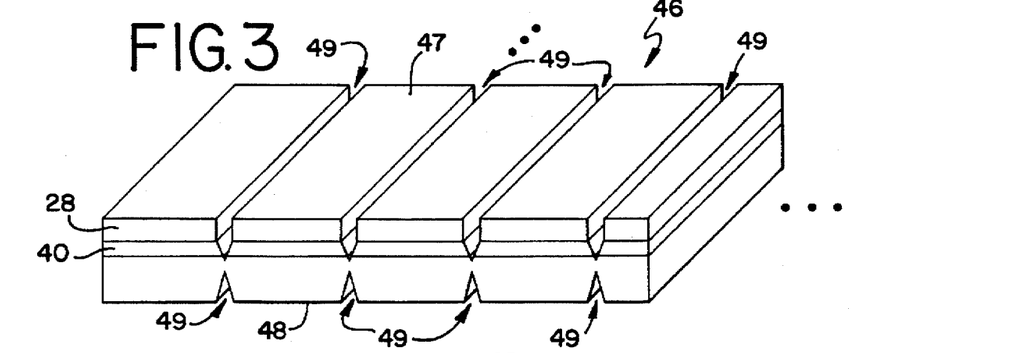
FIG. 3 is a perspective view of the substrate, the sheet of metal, and the layer of adhesive material therebetween from FIG. 1, with scoring lines therein, used to make a surface-mount fuse in accordance with the present invention.
Figure 4:
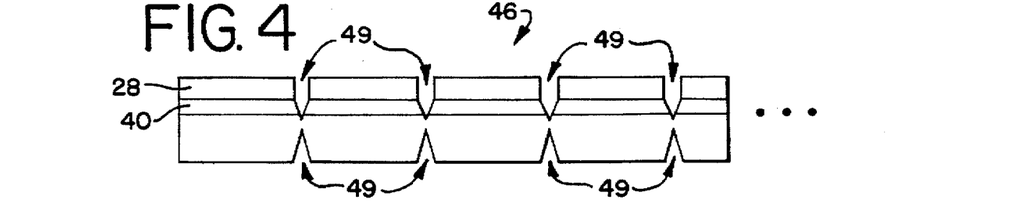
FIG. 4 is a side view of the view of FIG. 3.
Figure 5:
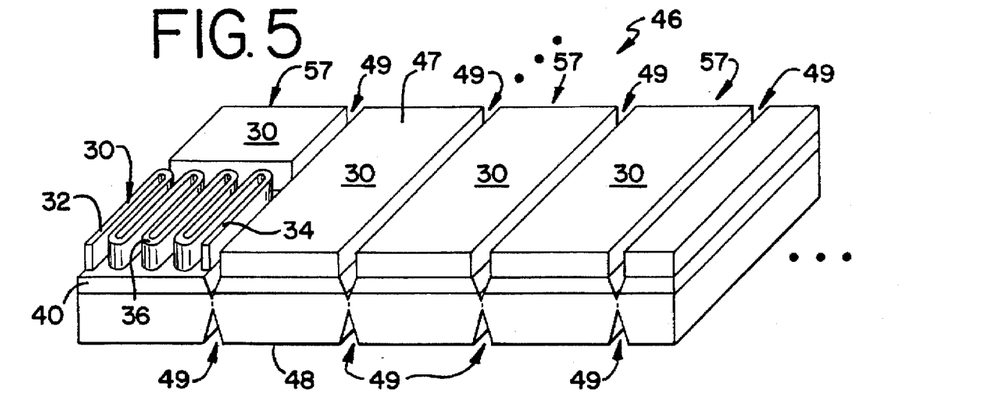
FIG. 5 is a perspective view of the substrate, the sheet of metal, and the layer of adhesive material therebetween, with scoring lines therein from, FIG. 3, shown with one metal strip etched therein, used to make a surface-mount fuse in accordance with the present invention.
Figure 6:
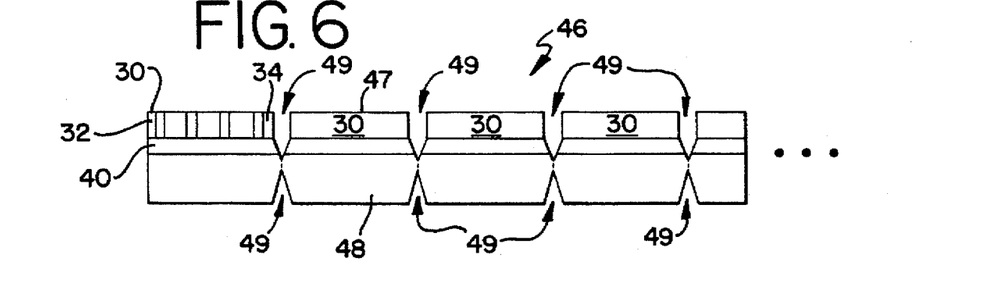
FIG. 6 is a side view of the view of FIG. 5.
Figure 7:
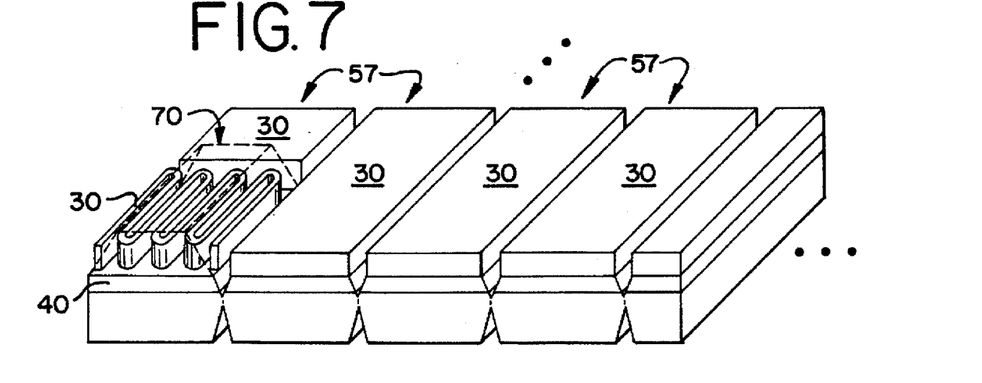
FIG. 7 is a perspective view of the substrate, the metal strip, and the layer of adhesive material therebetween, with scoring lines therein, from FIG. 5, with a protective layer on one of the fuses, used to make a surface-mount fuse in accordance with the present invention.
Figure 8:
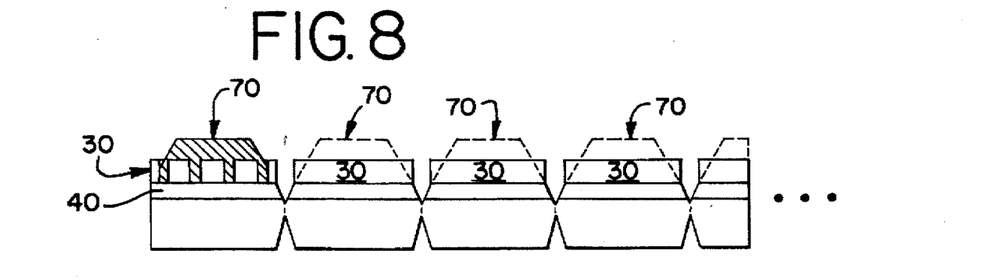
FIG. 8 is a side view of the view of FIG. 5, with the protective layer shown on all of the fuses.

The fuses 2, 2' from FIGS. 9 through 13 are manufactured from following general method of manufacture, and each fuse 2, 2' has variations depending on the specific embodiment being manufactured. For reference purposes and for a general understanding of manufacturing processes for surface-mount fuses and other surface-mountable devices, U.S. patent application Ser. No. 08/472,563, are incorporated herein by reference. In addition, for the purposes of this specification, the numbering in FIGS. 9 and 10, and 11 through 13 with a prime designation, that refer to a single fuse, also apply to the overall substrate and layers from which a plurality of fuses are derived, as shown in FIGS. 1 through 8. As such, the method of the present invention includes manufacturing a plurality surface-mount fuses 2, 2' from a single substrate 4. Turning to FIGS. 1 through 8, the method begins with providing a substrate 4 having first and second surfaces 6, 8, and having first, second, third, and fourth sides 18, 20, 22, 24. For reference, FIGS. 3 through 8 all show ". . ." designations which represent that the overall substrate extends further in those directions. The beginning substrate 4 is typically about 12 inches wide and 18 inches in length. The method also includes providing an adhesive and laying the adhesive across substantially the entire first surface 6 of the substrate 4 to form a layer of adhesive material 40. A sheet of metal 28 is further provided, and the sheet of metal 28 is laid on the layer of adhesive material 40. The sheet of metal can be a sheet of rolled metal foil, preferably a zinc alloy. However, other metals or metal alloys can be used as described above. The substrate 4, the layer of adhesive material 40, and the sheet of metal 28 are then laminated together to form a unitary laminated sheet 46 having a metal surface 47 and a substrate surface 48, as shown in FIGS. 1 and 2. The lamination step is performed through known lamination processes with the use of temperature and/or pressure and/or time, or combinations thereof. After lamination, the laminated sheet 46 may then put through a cold press.

The unitary laminated sheet 46 is then scored on the metal surface 47 and on the substrate surface 48 in substantially parallel columns 49. The scoring allows the unitary laminated sheet 46 to be broken into fuse strip columns 57, each column 57 having a plurality of fuses 2. The scoring step also includes scoring the unitary laminated sheet 46 on the metal surface 47 and on the substrate surface 48 in substantially parallel rows (not shown). The rows are generally perpendicular to the columns 49, and in combination with the columns, allow the laminated sheet 46 to be broken into individual fuses in a subsequent processing step. This scoring step can be performed before the following etching step, or afterwards. Scoring is typically cheaper than dicing, and is, therefore, the preferable way to separate the substrate with other fuse elements into individual fuses. If ceramics were being used as the substrate, then scribing would typically be performed instead of scoring, as is well known in the art. Although stated first herein, the scoring is preferably performed after the step of etching, described hereunder.

A plurality of patterns (only one is actually shown in FIGS. 5 through 10) are then etched into the sheet of metal 28 to form a plurality of unitary metal strips 30 (only one is actually shown in FIGS. 5 through 10). As described above, each metal strip 30 has a first connection region 32, a second connection region 34, and a fuse link 36 therebetween. The etching is performed through standard etching techniques through the use of photoresist and photo-lithography to define and shape the metal strip 30.

Figure 14:
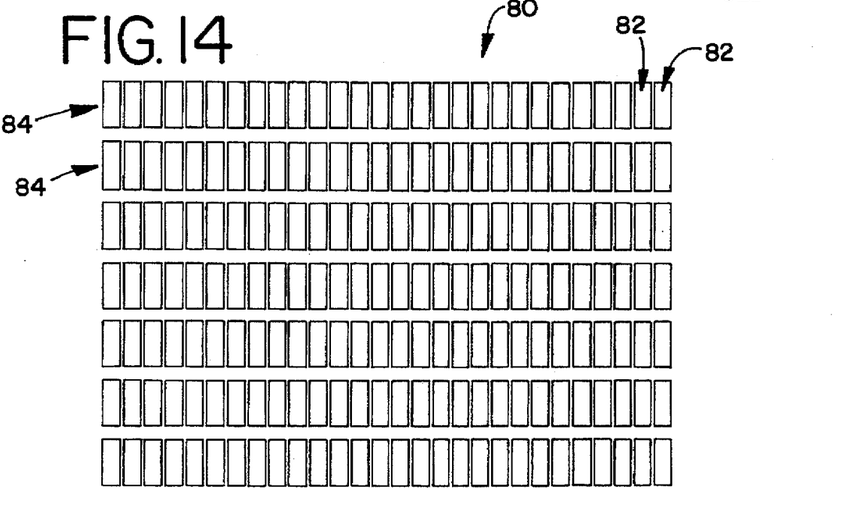
FIG. 14 is top view of one possible stencil used to apply the protective layer within a stencil printing process.

A protective layer 70 is then applied onto each fuse link 36 of each metal strip 30. One method of applying the protective layer 70 is through a stencil printing process with the use of a stencil printing machine. One stencil printing machine which can be used is made by Affiliated Manufacturers, Inc. of Northbranch, N.J., Model No. CP-885. Previous uses of stencil printing machines, for applying protective coatings on fuses, applied strands of coatings across numerous fuses before the substrate was diced into individual fuses. However, with the preferable use of the stencil 80 shown in FIG. 14, the method of applying protective layer 70 in the present invention applies a protective layer 70 to the individual fuses 2 created from the laminated sheet 46. This stencil 80 has a plurality of grooves 82, one for each protective layer 70 on each fuse 2, for allowing the protective layer material to pass through each groove 82 during stencil printing with the stencil printing machine (not shown). This stencil 80 can be stainless steel and have a thickness of 0.023 inches, but others can be used as well. Using this stencil 80 within the stencil printing machine, the squeegee speed is preferably about 3.5 inches per second for the preferred protective material mentioned above, but can range from about 0.5 to about 8 inches per second, depending on the particular material used. Alternatively, the grooves 82 could be opened along stencil rows 84 for applying a protective layer 70 to a full fuse strip column 57. The separation of the fuse strip columns 57 into individual fuses 2 would then separate the protective layer 70. Once the protective layer 70 is applied, the protective layer is then cured with an ultra-violet (UV) light source, with a wave-length of about 300 nanometers, providing about 150 to 300 milliWatts of power, depending on the material used, and the thickness thereof. The UV curing preferably takes place in a Nitrogen atmosphere, which increases the curing and decreases the tackiness to provide a more uniform curing of the protective layer 70.

In one form of the present invention, a solder material 60 (solder, solder paste, or flux material) is then applied to each of the first and second connection regions 32, 34. A plurality of first and second terminal leads 50, 52 are then placed on the solder material 60 applied to each of the first and second connection regions 32, 34, respectively. An alignment of the terminal leads 50, 52 may be needed at this point. The solder material 60 is then reflowed to provide a conductive connection between each of the first and second connection regions 32, 34 of the metal strips 30 and each of the respective first and second terminal leads 50, 52. A cleaning step is usually performed at this point.

The unitary laminated sheet 46 with the plurality of fuses 2 therein is then broken, diced, or otherwise separated into fuse strip columns 57, and the fuse strip columns 57 are broken, diced or otherwise separated into individual fuses 2. Testing and packaging is usually then performed.

Commensurate with one of the alternative apparatus embodiments discussed above, the step of providing an adhesive and laying the adhesive across substantially the entire first surface 6 of the substrate 4 to form a layer of adhesive material 40, is performed as follows. A polymeric material 40 is provided that has first and second polymeric surfaces 42, 44. The first and second polymeric surfaces 42, 44 have an adhesive attached thereto. The first polymeric surface 42 of the polymeric material 40 and the adhesive thereon are attached to the first surface 6 of the substrate 4. The sheet of metal 28 is laid or placed onto the layer of adhesive material 40 by laying the sheet of metal 28 onto the second polymeric surface 44 of the polymeric material 40 having the adhesive thereon. The step of laminating the substrate 4, the layer of adhesive material 40, and the sheet of metal 28 together to form a unitary laminated sheet 46 having a metal surface 47 and a substrate surface 48, is then performed by laminating the substrate 4, the polymeric material 40 having the adhesive on the first and second polymeric surfaces 42, 44, and the sheet of metal 38 together. As described above, the polymeric material is preferably a polyamide film or material, such as KAPTON, and the sheet of metal 28 is made from a sheet of zinc foil. When the polyamide is laminated to the substrate, the adhesive on the polyamide is actually cured to the substrate, as also takes place with the sheet of metal 28.

In an embodiment mentioned above, which makes use of the clip leads 50', 52', the clip leads 50', 52' are not attached until after the laminated sheet 46 (with other fuse elements such as the metal strip 30 and protective layer 70) is broken into columns 57 (commonly referred to as "strips"). Once the laminated sheet 46 (with other fuse elements) is broken into columns 57, a solder material is then applied to the connection regions 32', 34'. The clip leads 50', 52' can, alternatively, be provided with solder already existing on the clip leads 50', 52', wherein it is not necessary to apply the solder material directly to the connection regions 32', 34'. The first clip lead 50' is then attached to the substrate 4' and first connection region 32', and the second clip lead 52' is attached to the substrate 4' and second connection region 34', as shown in FIGS. 11 through 13. A flux material is then applied to the to the connection regions 32', 34' and surrounding area of the terminal connections between the clip leads 50', 52'. The solder is then reflowed to create a conductive connection. The steps of the clip lead attachment (with solder already existing on the clip leads 50', 52' or already existing on the connection regions 32', 34'), the flux material application, and the reflowing of the solder, alternatively, can all be preformed in one operation. In this one step operation, each column 57 is inserted into a lead-insertion-attachment-reflow machine which first inserts or attaches the clip leads 50', 52' onto the sides 18', 20' of the individual fuses 2' of the column 57. The clip leads 50', 52' can be pre-solder laden and pre-flux laden such that the next step in the process is only reflowing the solder and flux so that the leads 50', 52' are permanently attached to the sides 18', 20' of each fuse 2' and the respective connection regions 32', 34' of the metal strips 30 on the column 57. One significant advantage of this step is that the lead insertion and the reflow both occur in one step with the use of the lead-insertion-reflow machine. One source of this type of machine is NAS Corporation. U.S. Pat. Nos. 4,120,558, 4,203,648, and 4,605,278 are incorporated herein by reference for additional disclosure when these steps are used during manufacture. These types of clip leads or lead frames can be obtained from North American Specialties Corporation (NAS), 120-12 28th Avenue, Flushing, N.Y. 11354, USA.

Once this operation (or steps) is performed, a cleaning step is then performed, and the columns 57 are broken into individual fuses. The fuses are then tested, packaged, and are ready for placement into circuit boards.

It should be understood that the present invention can include a substrate 4 having drilled or punched holes or bores (not shown for attaching metalization to create the terminal leads 50, 52 (although not shown in this form). It should be further noted that the bores would be lined up into rows and columns, disposed over almost the entire substrate, typically two half bores per fuse 2. When the drilling or punching of the bores has been completed, the bored substrate 4 is then processed in a similar manner as described above. A conductive metal can then be placed in a notched section (half holes) conductively connected to the metal strip 30. As a result of this flexibility, specific electrical characteristics can be engineered into the fuse to meet varying needs of the ultimate user.

While the specific embodiments have been illustrated and described, numerous modifications come to mind without significantly departing from the spirit of the invention, and the scope of protection is only limited by the scope of the accompanying claims.

What is claimed is:

1. A surface-mount fuse for protecting a circuit including the fuse comprising:

a substrate having first and second surfaces, each surface having first, second, third, and forth ends, the substrate also having first, second, third, and fourth sides;

a metal strip evenly attached to the first surface of the substrate with a layer of adhesive material, the layer of adhesive material being disposed between the metal strip and the first surface of the substrate, the metal strip having a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate; and, first and second wire leads aligned substantially with and along the first and second connection regions, respectively, the first wire lead being conductively connected to the first connection region and horizontally projecting away from the first connection region, the second wire lead being conductively connected to the second connection region and horizontally projecting away from the second connection region, for connecting the fuse to the remainder of the circuit.

2. The surface-mount fuse of claim 1 wherein a protective layer is disposed on the fuse link, the protective layer being in contact with and surrounding the upper and side surfaces of the fuse link of the metal strip.

3. The surface-mount fuse of claim 2 wherein the protective layer is also in contact with at least a fraction of the first and second connection regions of the metal strip.

4. The surface-mount fuse of claim 2, wherein said protective layer is made of a polymeric material.

5. The surface-mount fuse of claim 2, wherein the protective layer is made of a polyurethane material.

6. The surface-mount fuse of claim 1, wherein the substrate is made of an FR-4 material.

7. The surface-mount fuse of claim 1, wherein the substrate is made of a melamine based composition.

8. The surface-mount fuse of claim 2, wherein the protective layer is clear and colorless.

9. The surface-mount fuse of claim 2, wherein the protective layer is clear and colored.

10. The surface-mount fuse of claim 2, wherein a solder material is disposed between the first and second wire leads and the first and second connection regions, respectively, of the metal strip, for connecting the first and second wire leads to the first and second connection regions.

11. The surface-mount fuse of claim 1, wherein the metal strip is made from a zinc alloy.

12. The surface-mount fuse of claim 1, wherein the metal strip is made from a sheet of zinc foil.

13. A surface-mount fuse for protecting a circuit including the fuse comprising:

a substrate having first and second surfaces, each surface having first, second, third, and forth ends, the substrate also having first, second, third, and fourth sides;

a metal strip evenly attached to the first surface of the substrate with a layer of polymeric material, the layer of polymeric material having first and second surfaces each respectively having an adhesive material attached thereto, the layer of polymeric material being disposed between the metal strip and the first surface of the substrate, the adhesive material on the first surface of the layer of polymeric material connecting the substrate to the first surface of the layer of polymeric material, and the adhesive material on the second surface of the layer of polymeric material connecting the metal strip to the second surface of the layer of polymeric material, wherein the metal strip has a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate;

a first terminal lead conductively connected to the first connection region and projecting away from the first connection region; and, a second terminal lead being conductively connected to the second connection region and projecting away from the second connection region, the first and second terminal leads connecting the fuse to the remainder of the circuit.

14. The surface-mount fuse of claim 13 wherein a protective layer is disposed on the fuse link, the protective layer being in contact with and surrounding the upper and side surfaces of the fuse link of the metal strip.

15. The surface-mount fuse of claim 14 wherein the protective layer is also in contact with at least a fraction of the first and second connection regions of the metal strip.

16. The surface-mount fuse of claim 14, wherein said protective layer is made of a polymeric material.

17. The surface-mount fuse of claim 14, wherein the protective layer is made of a polyurethane material.

18. The surface-mount fuse of claim 13, wherein the substrate is made of an FR-4 material.

19. The surface-mount fuse of claim 13, wherein the substrate is made of a melamine based composition.

20. The surface-mount fuse of claim 14, wherein the protective layer is clear and colorless.

21. The surface-mount fuse of claim 14, wherein the protective layer is clear and colored.

22. The surface-mount fuse of claim 14, wherein a solder material is disposed between the first and second terminal leads and the first and second connection regions, respectively, of the metal strip, for connecting the first and second terminal leads to the first and second connection regions.

23. The surface-mount fuse of claim 13, wherein the metal strip is made from a zinc alloy.

24. The surface-mount fuse of claim 13, wherein the metal strip is made from a sheet of zinc foil.

25. The surface-mount fuse of claim 13, wherein the layer of polymeric material is a polyamide.

26. A surface-mount fuse for protecting a circuit including the fuse comprising:

a substrate having first and second surfaces, each surface having first, second, third, and forth ends, the substrate also having first, second, third, and fourth sides;

a metal strip evenly attached to the first surface of the substrate with a layer of adhesive material, the layer of adhesive material being disposed between metal strip and the first surface of the substrate, the metal strip having a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate;

a first clip lead having at least one clip, each clip of the first clip lead having a mounting portion and a wrap-around portion, the wrap-around portion of each clip being aligned generally along the first connection region and first side of the substrate, and being conductively connected to the first connection region, wherein the wrap-around portion of each clip fastens the first clip lead to the substrate and first connection region, wherein the mounting portion of the first clip lead projects away from the first connection region; and, a second clip lead having at least one clip, each clip of the second clip lead having a mounting portion and a wrap-around portion, the wrap-around portion of each clip being aligned generally along the second connection region and second side of the substrate, and being conductively connected to the second connection region, wherein the wrap-around portion of each clip fastens the second clip lead to the substrate and second connection region, wherein the mounting portion of the second clip lead projects away from the second connection region, the first and second clip leads connecting the fuse to the remainder of the circuit.

27. The surface-mount fuse of claim 26 wherein a protective layer is disposed on the fuse link, the protective layer being in contact with and surrounding the upper and side surfaces of the fuse link of the metal strip.

28. The surface-mount fuse of claim 27 wherein the protective layer is also in contact with at least a fraction of the first and second connection regions of the metal strip.

29. The surface-mount fuse of claim 27, wherein said protective layer is made of a polymeric material.

30. The surface-mount fuse of claim 27, wherein the protective layer is made of a polyurethane material.

31. The surface-mount fuse of claim 26, wherein the substrate is made of an FR-4 material.

32. The surface-mount fuse of claim 26, wherein the substrate is made of a melamine based composition.

33. The surface-mount fuse of claim 27, wherein the protective layer is clear and colorless.

34. The surface-mount fuse of claim 27, wherein the protective layer is clear and colored.

35. The surface-mount fuse of claim 26, wherein a solder material is disposed between the first and second clip leads and the first and second connection regions, respectively, of the metal strip, for conductively connecting the first and second clip leads to the first and second connection regions.

36. The surface-mount fuse of claim 26, wherein the metal strip is made from a zinc alloy.

37. The surface-mount fuse of claim 26, wherein the metal strip is made from a sheet of zinc foil.

38. A surface-mount fuse for protecting a circuit including the fuse comprising:

a substrate having first and second surfaces, each surface having first, second, third, and forth ends, the substrate also having first, second, third, and fourth sides;

a metal strip evenly attached to the first surface of the substrate with a layer of polymeric material, the layer of polymeric material having first and second surfaces each respectively having an adhesive material attached thereto, the layer of polymeric material being disposed between the metal strip and the first surface of the substrate, the adhesive material on the first surface of the layer of polymeric material connecting the substrate to the first surface of the layer of polymeric material, and the adhesive material on the second surface of the layer of polymeric material connecting the metal strip to second surface of the layer of polymeric material, wherein the metal strip has a first connection region, a second connection region, and a fuse link therebetween having an upper surface and a side surface, the first connection region being disposed along substantially the full length of the first end of the first surface of the substrate, the second connection region being disposed along substantially the full length of the second end of the first surface of the substrate;

a first terminal lead conductively connected to the first connection region; and, a second terminal lead being conductively connected to the second connection region, the first and second terminal leads connecting the fuse to the remainder of the circuit.

* * * * *

UNITED STATES PATENT AND TRADEMARK OFFICE
CERTIFICATE OF CORRECTION

PATENT NO. : 5,699,032

DATED : December 16, 1997

INVENTOR(S) : Steven Francis Ulm, Jr., Edwin James Harrris IV, Matthew Michael Rybka

It is certified that error appears in the above-identified patent and that said Letters Patent is hereby corrected as shown below:

Column 6, Line 50 - insert the word "the" after the word "from"
Column 7, Line 18 - insert the word "be" after the word "then"
Column 9, Line 8 - remove second appearance of the words "to the"
Column 9, Line 41 - insert a ")" after the words "(not shown"

Signed and Sealed this

Fourteenth Day of April, 1998

Attest:

BRUCE LEHMAN

*Attesting Officer*       *Commissioner of Patents and Trademarks*